United States Patent
Hull Roskos

(10) Patent No.: US 8,924,173 B2
(45) Date of Patent: Dec. 30, 2014

(54) DETERMINING HARMONICS

(75) Inventor: Julie J. Hull Roskos, Forest Lake, MN (US)

(73) Assignee: Honeywell International Inc., Morristown, NJ (US)

( * ) Notice: Subject to any disclaimer, the term of this patent is extended or adjusted under 35 U.S.C. 154(b) by 627 days.

(21) Appl. No.: 13/186,042

(22) Filed: Jul. 19, 2011

(65) Prior Publication Data
US 2013/0024144 A1    Jan. 24, 2013

(51) Int. Cl.
G01R 25/00    (2006.01)
G01R 23/20    (2006.01)

(52) U.S. Cl.
CPC ................................. *G01R 23/20* (2013.01)
USPC .................... 702/65; 702/66; 702/75; 702/79

(58) Field of Classification Search
USPC ..................... 702/65, 66, 75, 79; 331/70, 176
See application file for complete search history.

(56) References Cited

U.S. PATENT DOCUMENTS 5,525,936 A * 6/1996 Post et al. ..................... 331/47
6,639,402 B2 * 10/2003 Grimes et al. ................ 324/239
7,679,463 B2 * 3/2010 Pernia et al. .............. 331/108 C

OTHER PUBLICATIONS

Lumasense Technologies, Fiber Optic Temperature Sensors, http://www.lumasenseinc.com/EN/products/fluoroptic-temperature-sensors/, 2011, accessed from website Jul. 19, 2011 (2 pgs.).

* cited by examiner

*Primary Examiner* — Elias Desta
(74) *Attorney, Agent, or Firm* — Brooks, Cameron & Huebsch, PLLC

(57) ABSTRACT

Methods, systems, and devices for determining a harmonic are described herein. One method includes determining a temperature of a circuit conductor while the circuit conductor is conducting a current, and determining a harmonic associated with the circuit conductor based, at least in part, on the determined temperature.

17 Claims, 1 Drawing Sheet

US 8,924,173 B2

DETERMINING HARMONICS

TECHNICAL FIELD

The present disclosure relates to methods, devices, and systems for determining harmonics.

BACKGROUND

Power system harmonics (e.g., integer multiples of a fundamental frequency of a power system) can cause a number of problems in power systems including, for example, voltage distortion, equipment degradation, increased power losses, mistiming of equipment, false equipment operations, and/or shortened equipment life. Harmonics can cause these problems, among others, in large-scale utilities of the power system (e.g., transformer and/or capacitor failures at a power substation) and/or at customer devices (e.g., variable frequency drives (VFDs), among others).

Voltage and/or current measuring devices can be used to determine (e.g., detect) harmonics associated with a power system. However, costs associated with voltage and/or current measuring devices can be prohibitively high because installation of such devices may require a power outage (e.g., the power of the power system may need to be turned off in order to install such measuring devices). Further, such a power outage may inconvenience customers, especially customers (e.g., businesses) that may be economically impacted by an outage.

DETAILED DESCRIPTION

Methods, devices, and systems for determining a harmonic are described herein. One or more method embodiments include determining a temperature of a circuit conductor while the circuit conductor is conducting a current, and determining a harmonic associated with the circuit conductor based, at least in part, on the determined temperature.

Harmonic detectors in accordance with one or more embodiments of the present disclosure can be installed without the need for a power outage. Accordingly, one or more embodiments of the present disclosure can determine harmonics in a convenient and/or low cost manner.

Additionally, one or more embodiments of the present disclosure can determine harmonics at a large-scale level (e.g., at a power substation) and/or at a customer site (e.g., at a customer device). Further, one or more embodiments of the present disclosure can determine a location of a number of harmonics. Additionally, one or more embodiments of the present disclosure can compare a determined harmonic with a historical threshold and/or communicate the determined harmonic to a user device.

In the following detailed description, reference is made to the accompanying drawings that form a part hereof. The drawings show by way of illustration how one or more embodiments of the disclosure may be practiced. These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

As used herein, "a" or "a number of" something can refer to one or more such things. For example, "a number of temperature sensors" can refer to one or more temperature sensors.

Figure 1:
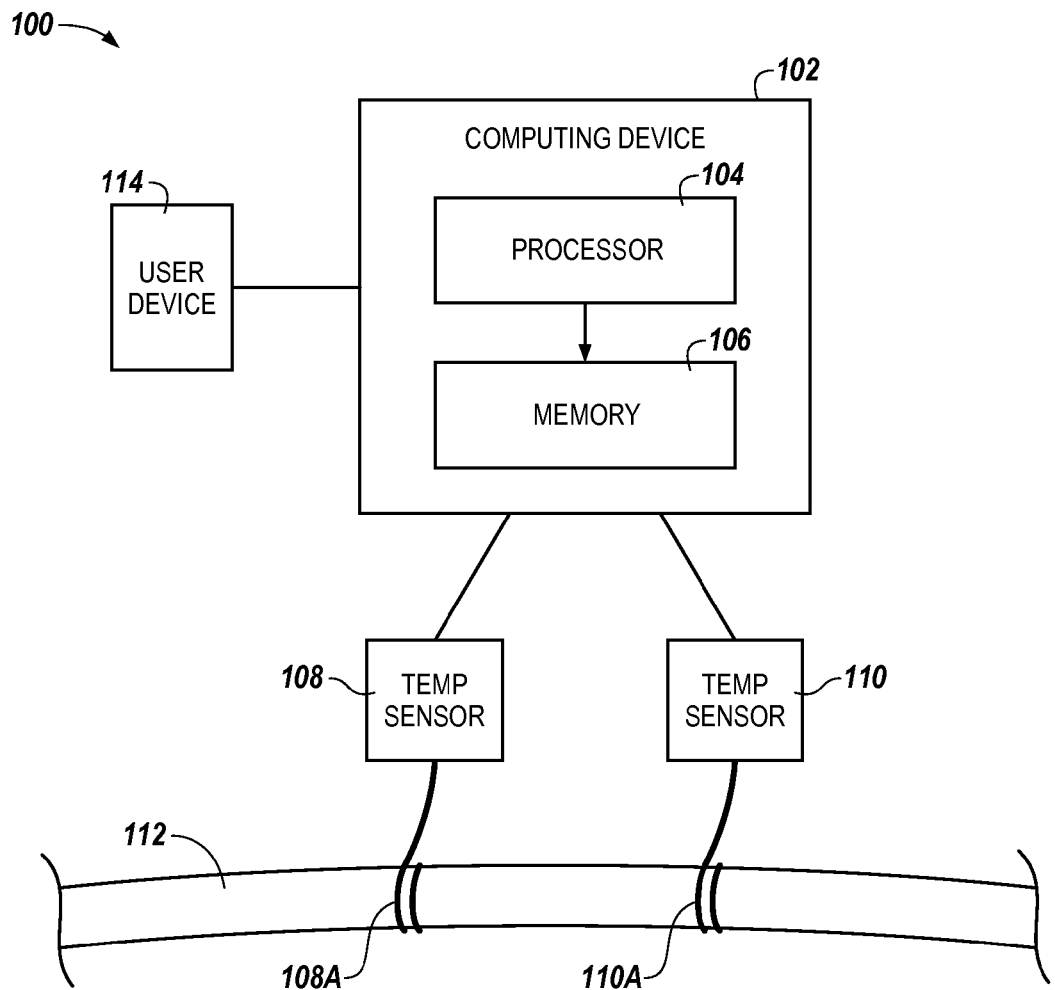
FIG. 1 is a block diagram illustrating a system for determining a harmonic in accordance with one or more embodiments of the present disclosure.

FIG. 1 illustrates a system 100 for determining a harmonic in accordance with one or more embodiments of the present disclosure. As shown in FIG. 1, system 100 includes a computing device 102 communicatively coupled to user device 114, and temperature sensors 108 and 110. A communicative coupling can include wired and/or wireless connections and/or networks such that data can be transferred in any direction between computing device 102, user device 114, and temperature sensors 108 and 110.

As shown in FIG. 1, temperature sensors 108 and 110 can each include a data acquisition portion (DAP) 108a and DAP 110a that are coupled to (e.g., surround) a circuit conductor 112. The DAPs 108a and 110a can, independently or in combination, sense (e.g., acquire, detect, and/or measure) temperature data associated with circuit conductor 112. Although two temperature sensors are shown in FIG. 1, system 100 can include any number of temperature sensors and/or any number of DAPs associated with the temperature sensor(s).

In the embodiment illustrated in FIG. 1, DAPs 108a and 110a include filaments (e.g., filaments including a number of optical fibers) wrapped around circuit conductor 112 to sense temperature data associated with circuit conductor 112. However, temperature sensors 108 and 110 can be any type of device that can sense temperature data associated with circuit conductor 112. Moreover, embodiments of the present disclosure do not limit DAP 108a and/or DAP 110a to positions surrounding circuit conductor 112; rather, DAP 108a and/or DAP 110a can be positioned in any configuration suitable for temperature sensing, including, for example, substantially parallel to a longitudinal axis of circuit conductor 112. Further, embodiments of the present disclosure do not limit DAP 108a and/or DAP 110a to positions that contact circuit conductor 112; rather, DAP 108a and/or DAP 110a can sense a temperature of circuit conductor 112 without contacting it, for example, by sensing infrared radiation of circuit conductor 112.

Circuit conductor 112 can be, include, and/or be a part of, for example, a wire, a cable, a circuit breaker, a transformer, a generator, a battery charger, an electronic ballast, a variable frequency drive (VFD), a capacitor, a rectifier with a capacitor input filter and/or combinations of these circuit conductors and/or others. Circuit conductor 112 can be, include, and/or be a part of, for example, a part of a large-scale utility (e.g., a transformer) and/or a smaller-scale customer device (e.g., a non-linear customer device such as a variable frequency drive). Embodiments of the present disclosure do not limit circuit conductor 112 to a particular type of circuit conductor; rather, circuit conductor 112 can be any circuit conductor in which one or more harmonics can exist.

As shown in FIG. 1, computing device 102 includes a processor 104 and a memory 106. As shown in FIG. 1, memory 106 can be coupled to processor 104.

Memory 106 can be volatile or nonvolatile memory. Memory 106 can also be removable (e.g., portable) memory, or non-removable (e.g., internal) memory. For example, memory 106 can be random access memory (RAM) (e.g., dynamic random access memory (DRAM), and/or phase change random access memory (PCRAM)), read-only memory (ROM) (e.g., electrically erasable programmable read-only memory (EEPROM), and/or compact-disk read-only memory (CD-ROM)), flash memory, a laser disk, a digital versatile disk (DVD), and/or other optical disk storage), and/or a magnetic medium such as magnetic cassettes, tapes, or disks, among other types of memory.

Further, although memory 106 is illustrated as being located in computing device 102, embodiments of the present disclosure are not so limited. For example, memory 106 can also be located internal to another computing resource, e.g., enabling computer readable instructions to be downloaded over the Internet or another wired or wireless connection.

Memory 106 can store executable instructions, such as, for example, computer readable instructions (e.g., software), for determining a harmonic in accordance with one or more embodiments of the present disclosure. For example, memory 106 can store executable instructions for determining a harmonic associated with circuit conductor 112 based, at least in part, on a determined temperature of circuit conductor 112, in accordance with one or more embodiments of the present disclosure. Memory 106 can store the determined harmonic and/or data indicating a determined harmonic. Data indicating a determined harmonic can include, for example, data gathered from temperature sensors 108 and/or 110, and/or predefined data stored in memory 106.

Processor 104 can execute the executable instructions stored in memory 106 to determine a harmonic in accordance with one or more embodiments of the present disclosure. For example, processor 104 can execute the executable instructions stored in memory 106 to determine a harmonic associated with circuit conductor 112 based, at least in part, on a determined temperature of circuit conductor 112, in accordance with one or more embodiments of the present disclosure.

User device 114 can be a computing device analogous to computing device 102. However, embodiments of the present disclosure do not limit user device 114 to a particular type of device. For example, user device 114 can be a mobile device (e.g., a cellular telephone, and/or a personal digital assistant (PDA), among other mobile devices).

Temperature sensor 108 and/or 110 can determine (e.g., sense) a temperature of circuit conductor 112 (e.g., a temperature of a portion of circuit conductor 112). For example, temperature sensors 108 and 110 can determine the temperature of circuit conductor 112 using temperature data associated with circuit conductor 112 sensed by DAPs 108a and 110a.

Temperature sensor 108 and/or 110 can determine a temperature of circuit conductor 112 at a predetermined time and/or at a predetermined interval. In one or more embodiments of the present disclosure, temperature sensors 108 and/or 110 can communicate (e.g., transmit) the determined temperature(s) to computing device 102. Temperature sensor 108 and/or 110 can, for example, communicate the determined temperature(s) upon determination, and/or can communicate the determined temperature(s) at a predetermined time and/or a predetermined interval. Additionally and/or alternatively, temperature sensors 108 and/or 110 can determine temperature continuously and communicate determined temperatures that exceed a threshold (e.g., a temperature spike and/or a change in temperature over time).

Computing device 102 can receive the determined temperature(s) from temperature sensor 108 and/or 110 and determine a harmonic associated with circuit conductor 112 based, at least in part, on the determined temperature(s). The harmonic associated with circuit conductor 112 can be, for example, an integer multiple of a fundamental frequency of circuit conductor 112. Embodiments of the present disclosure do not limit computing device 102 to determining harmonics based solely on temperatures. For example, computing device 102 can additionally receive a determined current being conducted by circuit conductor 112 from any suitable source, including, for example, a current meter and/or a multimeter (not shown in FIG. 1), and determine a harmonic associated with circuit conductor 112 based, at least in part on the determined current.

Temperature sensor 108 and/or 110 can additionally determine conditions (e.g., environmental conditions) adjacent to (e.g., surrounding) circuit conductor 112. Conditions adjacent to circuit conductor 112 can include, for example, ambient temperature, solar index, and/or humidity, among other environmental conditions. Such conditions can be determined by temperature sensor 108 and/or 110, as previously discussed, and/or can be determined by another means, such as, for example, a number of additional sensors and/or sources.

An increased temperature can, for example, indicate the presence of a number of harmonics. For example, if a first temperature of circuit conductor 112 determined by temperature sensor 108 is 150 degrees Fahrenheit, and a second, later, temperature of circuit conductor 112 is determined to be 190 degrees Fahrenheit, computing device 102 can determine a harmonic (e.g., the presence of a harmonic) within circuit conductor 112. The determined current, as previously discussed, can be used by computing device 102 to determine a harmonic associated with circuit conductor 112, because the presence of a harmonic and/or multiple harmonics can increase a current through circuit conductor 112 by, for example, creating a magnetic field and/or a number of eddy currents in a core of circuit conductor 112.

Computing device 102 can determine an order of the harmonic based on the temperature received from temperature sensor 108 and/or 110. For example, a triplen (e.g., third, sixth, and/or ninth) harmonic can, in some instances, increase a temperature of circuit conductor 112 a greater degree than, for example, a seventh harmonic. Computing device 102 can determine that a zero sequence current in circuit conductor 112 has been increased by, for example, a triplen harmonic due to a large amount of an increase in a temperature of circuit conductor 112.

Computing device 102 can receive temperature data from multiple temperature sensors (e.g., temperature sensors 108 and 110, among others) to determine, for example, a location of a number of harmonics associated with circuit conductor 112. For example, a higher temperature determined at temperature sensor 108 than temperature sensor 110 can indicate that a harmonic associated with circuit conductor 112 is occurring closer in proximity to temperature sensor 108 than temperature sensor 110. Temperature data from multiple temperature sensors can also determine a direction (e.g., upstream and/or downstream) of a harmonic.

In some embodiments, computing device 102 can determine whether the determined harmonic exceeds a historical threshold. As previously discussed, computing device 102 includes memory 106 which can store data indicating determined harmonics. Computing device 102 can determine a harmonic associated with circuit conductor 112, and compare the determined harmonic with historical data relating to, for example, determined temperatures and/or harmonics stored in memory 106. In various embodiments, memory 106 can store temperature threshold data that computing device 102 can use to determine whether temperature data (e.g., newly-acquired temperature data from temperature sensor 108 and/or 110) indicates the presence of one or more harmonics. For example, if temperature sensor 108 determines a temperature and communicates that temperature to computing device 102, computing device 102 can determine whether that temperature exceeds a threshold temperature thereby indicating a harmonic.

Historical data can also be used by computing device 102 to determine whether to communicate the determined harmonic to user device 114. For example, computing device 102 may not communicate all determined harmonics to user device 114. Computing device 102 can store a threshold in memory 106 such that only a determined harmonic that exceeds the threshold is communicated to user device 114.

User device 114 can receive the determined harmonic(s) from computing device 102 and can, for example, display the determined harmonic(s) to a user. Embodiments of the present disclosure do not limit user device 114 to a particular type of display and/or graphic depiction. For example, user device 114 can display that a harmonic has been determined by computing device 102 and/or can display the location of the determined harmonic within circuit conductor 112 via a diagram of circuit conductor 112. User device 114 can display the determined harmonic along with a number of options, including, for example, "shut down," "ignore," "monitor," etc. As previously discussed, embodiments of the present disclosure do not limit user device 114 to a particular type of device. For example, user device 114 can be a terminal in a power substation, a mobile device, a personal computer, etc. Although shown as a single device in FIG. 1, embodiments of the present disclosure can include multiple user devices in system 100.

Figure 2:
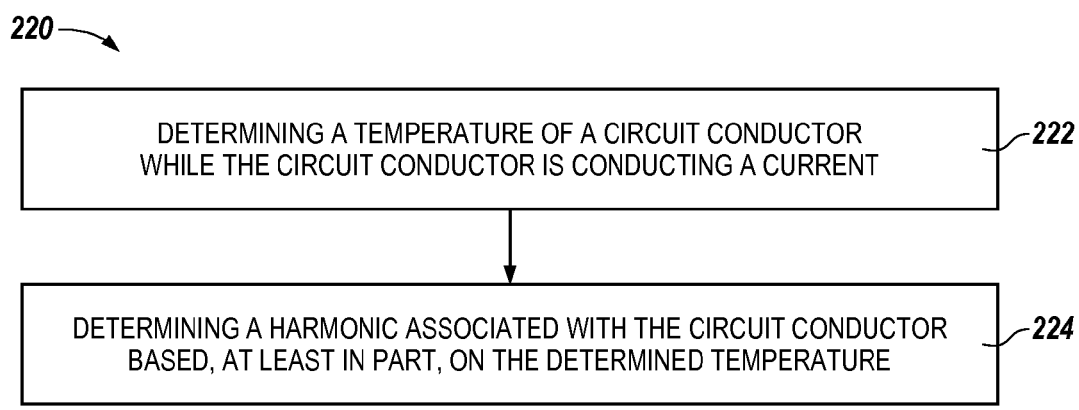
FIG. 2 illustrates a method for determining a harmonic in accordance with one or more embodiments of the present disclosure.

FIG. 2 illustrates a method 220 for determining a harmonic in accordance with one or more embodiments of the present disclosure. Method 220 can be performed, for example, by computing device 102 previously discussed in connection with FIG. 1.

At block 222, method 220 includes determining a temperature of a circuit conductor (e.g., circuit conductor 112 previously described in connection with FIG. 1) while the circuit conductor is conducting a current. The temperature of the circuit conductor can be determined, for example, through the use of one or more temperature sensors (e.g., temperature sensors 108 and/or 110 previously discussed in connection with FIG. 1) in a manner such as that previously discussed in connection with FIG. 1.

Although not shown in FIG. 2, method 220 can include determining a temperature of an environment adjacent to (e.g., surrounding) the circuit conductor and determining a direction of a power flow based, at least in part, on the temperatures of a first portion of the circuit conductor, a second portion of the circuit conductor, and the environment in a manner analogous to that previously discussed in connection with FIG. 1.

At block 224, method 220 includes determining a harmonic associated with the circuit conductor based, at least in part, on the determined temperature. The harmonic can, for example, be determined in a manner such as that previously discussed in connection with FIG. 1.

In some embodiments, methods can include determining a current of the circuit conductor, and determining a harmonic based, at least in part, on the temperature and the current in a manner analogous to that previously discussed in connection with FIG. 1. Although not shown in FIG. 2, method 220 can include determining a first temperature and a second temperature from the circuit conductor and determining a harmonic based on the first and second temperatures, for example, in a manner such as that previously discussed in connection with FIG. 1.

Some method embodiments can include determining a temperature of a portion of the circuit conductor, and determining a temperature of a second portion of the circuit conductor. Determining temperatures in two different locations of the circuit conductor can, for example, allow numbers and/or locations of harmonics in the circuit conductor to be determined in manners such as those previously discussed in connection with FIG. 1.

Method embodiments can include determining whether the determined harmonic exceeds a historical threshold, for example, in a manner such as that previously discussed in connection with FIG. 1. Although not shown in FIG. 2, method 220 can include communicating the harmonic to a user device, for example, in a manner such as that previously discussed in connection with FIG. 1. Method embodiments can additionally include communicating a number of trends in determined harmonics.

Methods, systems, and devices in accordance with one or more embodiments of the present disclosure can detect harmonics without the need for a power outage. Accordingly, one or more embodiments of the present disclosure can determine harmonics in a convenient and/or low cost manner.

Additionally, one or more embodiments of the present disclosure can determine harmonics at a large-scale level (e.g., at a power substation) and/or at a customer site (e.g., at a customer device). Further, one or more embodiments of the present disclosure can determine a location of a number of harmonics. Additionally, one or more embodiments of the present disclosure can compare a determined harmonic with a historical threshold and/or communicate the determined harmonic to a user device.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method for determining a harmonic, comprising:
determining, by a processor, a temperature of a first portion of a circuit conductor using a device while the circuit conductor is conducting a current, wherein the device does not conduct the current;
determining, by a processor, a temperature of a second portion of the circuit conductor using a device while the circuit conductor is conducting the current; and
determining, by a processor, a location of a harmonic associated with the circuit conductor based, at least in part, on the determined temperatures of the first and second portions of the circuit conductor.

2. The method of claim 1, wherein the method includes:
determining the current; and
determining the harmonic associated with the circuit conductor based, at least in part, on the temperature and the current.

3. The method of claim 1, wherein the method includes:
determining a number of harmonics associated with the circuit conductor based, at least in part, on the temperatures of the first and second portions of the circuit conductor.

4. The method of claim 1, wherein the method includes determining whether the harmonic exceeds a historical threshold.

5. The method of claim 1, wherein the method includes communicating the harmonic to a user device.

6. A system comprising:
a first temperature sensor configured to determine a temperature of a first portion of a circuit conductor while the circuit conductor is conducting a current, wherein the first temperature sensor does not conduct the current;
a second temperature sensor configured to determine a temperature of a second portion of the circuit conductor while the circuit conductor is conducting the current and
a computing device configured to:
receive the temperatures from the first and second temperature sensors; and
determine a location of a harmonic associated with the circuit conductor based, at least in part, on the temperatures.

7. The system of claim 6, wherein the circuit conductor is a wire.

8. The system of claim 6, wherein the circuit conductor is one of a transformer, a capacitor, and a nonlinear customer device.

9. The system of claim 6, wherein the first and second temperature sensors are configured to determine the temperature of the first and second portions of the circuit conductor at a predetermined interval.

10. The system of claim 6, wherein a portion of the first temperature sensor surrounds a portion of the circuit conductor.

11. The system of claim 6, wherein the first temperature sensor is positioned parallel to a longitudinal axis of the circuit conductor.

12. A computing device for determining a harmonic, comprising:
a memory; and
a processor coupled to the memory, wherein the processor is configured to execute executable instructions stored in the memory to:
receive temperature data associated with a first portion and a second portion of a circuit conductor and respectively determined by a first device and a second device, wherein the temperature data includes temperature data associated with the circuit conductor while the circuit conductor conducts a current, and wherein the first device and second device do not conduct the current; and
determine a location of a harmonic associated with the circuit conductor based, at least in part, on the received temperature data.

13. The computing device of claim 12, wherein the processor is configured to execute executable instructions stored in the memory to determine that temperature data indicating an increased temperature of the circuit conductor is associated with the determined harmonic.

14. The computing device of claim 12, wherein the processor is configured to execute executable instructions stored in the memory to display the location of the determined harmonic.

15. The computing device of claim 12, wherein the memory is configured to store the location of the determined harmonic.

16. The computing device of claim 12, wherein the processor is configured to execute executable instructions stored in the memory to determine whether the determined harmonic exceeds a threshold stored in the memory.

17. The computing device of claim 12, wherein the processor is configured to execute executable instructions stored in the memory to determine an order of the determined harmonic.

* * * * *